(12) United States Patent
Utsunomiya

(10) Patent No.: US 10,840,193 B2
(45) Date of Patent: Nov. 17, 2020

(54) SEMICONDUCTOR DEVICE

(71) Applicant: ABLIC Inc., Chiba (JP)

(72) Inventor: Hiroyuki Utsunomiya, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/428,335

(22) Filed: May 31, 2019

(65) Prior Publication Data

US 2019/0371742 A1 Dec. 5, 2019

(30) Foreign Application Priority Data

Jun. 1, 2018 (JP) .................................. 2018-106048

(51) Int. Cl.
| | |
|---|---|
| *H01L 23/44* | (2006.01) |
| *H01L 23/00* | (2006.01) |
| *H01L 23/544* | (2006.01) |
| *H01L 23/58* | (2006.01) |

(52) U.S. Cl.
CPC .......... *H01L 23/562* (2013.01); *H01L 23/544* (2013.01); *H01L 23/564* (2013.01); *H01L 23/585* (2013.01); *H01L 2223/5446* (2013.01)

(58) Field of Classification Search
CPC .............................. H01L 23/562; H01L 23/564
See application file for complete search history.

(56) References Cited

U.S. PATENT DOCUMENTS

| | | | | |
|---|---|---|---|---|
| 5,620,917 | A | * | 4/1997 | Yoon ................. H01L 27/10808 438/253 |
| 5,885,857 | A | * | 3/1999 | Yamaha .............. H01L 23/3171 257/E23.132 |
| 2005/0184362 | A1 | | 8/2005 | Fujita |
| 2011/0233735 | A1 | | 9/2011 | Yoshizawa et al. |
| 2014/0264767 | A1 | | 9/2014 | Gratz et al. |
| 2015/0357293 | A1 | | 12/2015 | Tomita |
| 2016/0013137 | A1 | | 1/2016 | Hiyoshi et al. |

FOREIGN PATENT DOCUMENTS

| | | |
|---|---|---|
| JP | 5830843 B2 | 12/2015 |
| JP | 2016-018952 A | 2/2016 |

OTHER PUBLICATIONS

Extended European Search Report in Europe Application No. 19176513.0, dated Oct. 28, 2019, 5 pages.

* cited by examiner

*Primary Examiner* — Samuel A Gebremariam
(74) *Attorney, Agent, or Firm* — Brinks Gilson & Lione

(57) ABSTRACT

A semiconductor device includes a semiconductor substrate 101 containing a circuit region CR and a chip outer peripheral region PR provided adjacent thereto, a first interlayer-insulating film 102 provided on the semiconductor substrate 101, a second interlayer-insulating film 104 provided on the first interlayer-insulating film 102, a first step ST1 provided between the semiconductor substrate 101 and the first interlayer-insulating film 102 so that the chip outer peripheral region PR side is lower than the circuit region CR side in the chip outer peripheral region PR, and a second step ST2 located on the circuit region CR side relative to the first step ST1 and provided in the second interlayer-insulating film 104 in the chip outer peripheral region PR.

11 Claims, 9 Drawing Sheets

SEMICONDUCTOR DEVICE

RELATED APPLICATIONS

Priority is claimed on Japanese Patent Application No. 2018-106048, filed on Jun. 1, 2018, the content of which is incorporated herein by reference.

BACKGROUND OF THE INVENTION

1. Field of the Invention

The present invention relates to a semiconductor device.

2. Description of the Related Art

A semiconductor substrate (semiconductor wafer) on which semiconductor devices are made generally includes a plurality of chip regions and regions (hereinafter also referred to as scribe lines) for singularization of the plurality of chip regions into semiconductor chips by dicing. It is known that a crack is generated from the dicing surface in performing the dicing of the semiconductor substrate by a blade.

Accordingly, the width of the scribe line needs to be set considering not only the kerf (blade) width but the width in which the crack progresses. Since the width in which the crack progresses is large, however, there arises a problem that addition of the value of the width to the kerf width widens the scribe line and increases the chip size.

Hence, various approaches have been proposed to provide a structure which suppresses entry of the crack into a circuit region progressing from the scribe lines due to dicing near the boundary between the circuit region and the scribe lines.

As one of the approaches, according to Japanese Patent No. 5830843 (see particularly FIG. 4), a crack prevention insulating film formed to stride a chip region and a scribe line simultaneously with an STI isolation region and a crack prevention ring formed thereon by lamination of a contact layer and a wiring layer containing metal are provided. Hence, when a crack (hereinafter also referred to as a substrate crack) propagates through the inside of a semiconductor substrate from the scribe lines, the substrate crack is made to propagate to the route along the side surface of the crack prevention ring from the side surface of the crack prevention insulating film to be guided upward.

SUMMARY OF THE INVENTION

However, when the crack propagates to progress along the side surface of the crack prevention ring, the metal layer forming the crack prevention ring is exposed. Hence, the metal layer causes oxidation expansion to serve as another starting point of a crack, and thus the reliability decreases.

Accordingly, it is an object of the present invention to provide a semiconductor device capable of preventing a crack due to dicing from reaching a circuit region of a semiconductor chip while maintaining reliability.

A semiconductor device according to an embodiment of the present invention includes a semiconductor substrate containing a circuit region and a chip outer peripheral region provided adjacent to the circuit region, a first interlayer-insulating film provided on the semiconductor substrate, a second interlayer-insulating film provided on the first interlayer-insulating film, a first step in a boundary portion provided between the semiconductor substrate and the first interlayer-insulating film so that a surface of the chip outer peripheral region side is lower than a surface of the circuit region side in the chip outer peripheral region, and a second step located on the circuit region side relative to the first step and provided in the second interlayer-insulating film in the chip outer peripheral region.

According to the present invention, a crack generated by dicing can be prevented from reaching a circuit region.

DETAILED DESCRIPTION OF THE PREFERRED EMBODIMENTS

Hereinafter, an embodiment for implementing the present invention is described in detail with reference to the drawings.

Figure 1A:
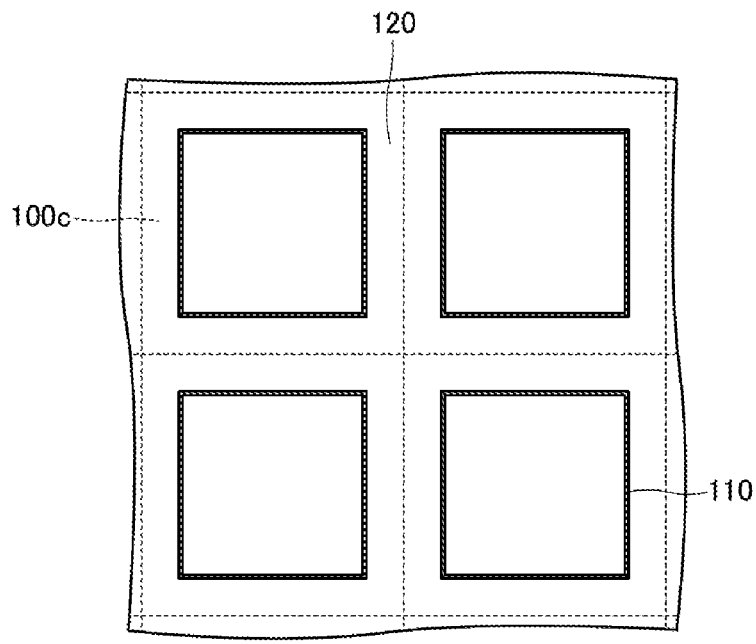
FIG. 1A is a plan view illustrating a semiconductor device in a wafer shape according to an embodiment of the present invention and FIG. 1B is a plan view illustrating a shape where the semiconductor device in the wafer shape illustrated in FIG. 1A is singularized into a plurality of semiconductor chips.
Figure 1B:
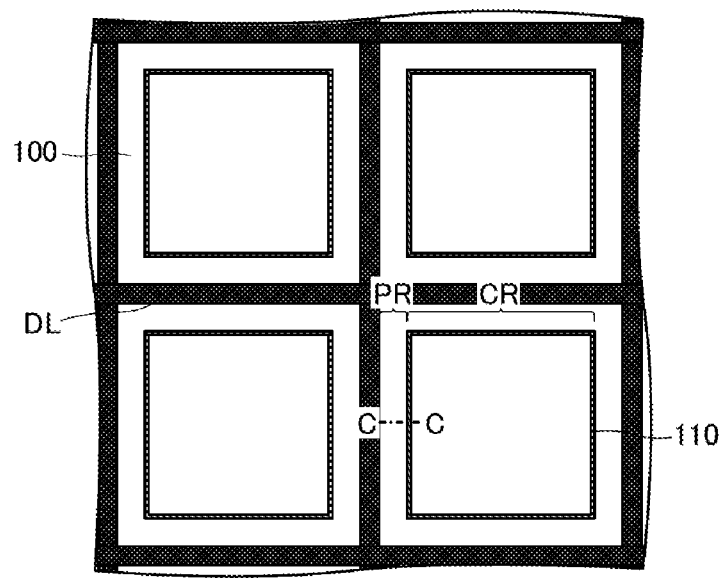

FIG. 1A is a plan view illustrating a semiconductor device in a wafer shape according to an embodiment of the present invention. FIG. 1B is a plan view illustrating a shape where the semiconductor device in the wafer shape illustrated in FIG. 1A is singularized into a plurality of semiconductor chips 100.

As illustrated in FIG. 1A, the semiconductor device of the embodiment includes a plurality of chip regions 100c indicated by the dashed lines and includes a seal ring 110 in each chip region 100c in the wafer shape. A scribe line 120 is provided on the outside of each seal ring 110. The semiconductor device in the wafer shape illustrated in FIG. 1A is cut by a dicing blade along the scribe lines 120 to be divided by dicing lines DL to be singularized into the plurality of semiconductor chips 100 as illustrated in FIG. 1B. Each of the singularized semiconductor chips 100 has a circuit region CR containing the seal ring 110 and a chip outer peripheral region PR provided to be adjacent to the circuit region CR and surround the circuit region CR.

Figure 2:
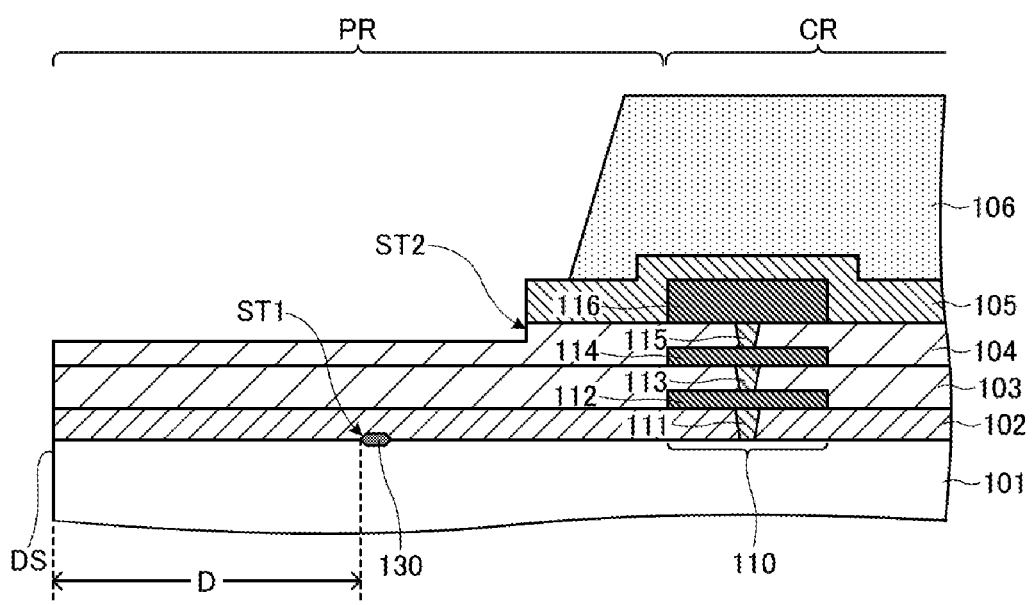
FIG. 2 is a cross-sectional view along the C-C line of FIG. 1B.

FIG. 2 is a figure illustrating the structure of the semiconductor device of the embodiment and is a cross-sectional view along the C-C line of FIG. 1B.

As illustrated in FIG. 2, the semiconductor device of the embodiment includes a semiconductor substrate 101, the seal ring 110 provided in the circuit region CR in the semiconductor substrate 101, interlayer-insulating films 102, 103, and 104 laminated on the semiconductor substrate 101, a passivation film 105 containing a silicon nitride film or the like formed on the interlayer-insulating film 104, and an organic insulating film 106 containing polyimide or the like formed on the passivation film 105.

The seal ring 110 contains a metal plug 111 connected to the semiconductor substrate 101 and provided in the interlayer-insulating film 102, a metal film 112 connected to the metal plug 111 and provided on the interlayer-insulating film 102, a metal plug 113 connected to the metal film 112 and provided in the interlayer-insulating film 103, a metal film 114 connected to the metal plug 113 and provided on the interlayer-insulating film 103, a metal plug 115 connected to the metal film 114 and provided in the interlayer-insulating film 104, and a metal film 116 connected to the metal plug 115 and provided on the interlayer-insulating film 104. The metal film 116 of the top layer is covered with the passivation film 105.

The semiconductor device further includes a step ST1 provided in a boundary portion between the semiconductor substrate 101 and the interlayer-insulating film 102, which is also called as the first interlayer-insulating film, and a step ST2 located on the circuit region CR side relative to the step ST1 and provided in the interlayer-insulating film 104, which is also called as the second interlayer-insulating film, in the chip outer peripheral region PR so that a surface of the step ST1 in the chip outer peripheral region PR side is lower than a surface of the step ST1 in the circuit region CR side in the chip outer peripheral region PR. Herein, the step ST1 is formed by an inclined portion on the chip outer peripheral region PR side of a LOCOS film 130 provided on the surface of the semiconductor substrate 101 in a portion projecting from the surface of the semiconductor substrate 101.

According to the semiconductor device of the embodiment having the above-described configuration, the following effects are obtained in the cutting of the semiconductor device in the wafer shape illustrated in FIG. 1A along the dicing lines DL as illustrated in FIG. 1B.

In FIG. 2, an end portion on the side opposite to the circuit region CR in the chip outer peripheral region PR is a dicing surface DS. Once a substrate crack is generated in the semiconductor substrate 101 from the dicing surface DS by performing dicing, the substrate crack progresses upward therefrom to reach the interface between the semiconductor substrate 101 and the interlayer-insulating film 102. Then, the crack progresses not upward but toward the circuit region CR along the interface therefrom because the interface between the semiconductor substrate 101 and the interlayer-insulating film 102 is a portion where the adhesion strength is low. A crack generated in the interface between the semiconductor substrate 101 and the interlayer-insulating film 102 in the dicing surface DS also progresses directly toward the circuit region CR along the interface for the same reason. Reach of the crack to the step ST1 triggers the change of the movement direction of the crack to the upward. Moreover, since the step ST2 is a portion where stress concentrates particularly, the crack is guided to the step ST2 provided in the interlayer-insulating film 104 to reach the surface of the interlayer-insulating film 104. Accordingly, the crack can be prevented from reaching the circuit region CR.

Although in FIG. 2 the inclined portion on the chip outer peripheral region PR side in the portion projecting from the surface of the semiconductor substrate 101 of the LOCOS film 130 provided on the surface of the semiconductor substrate 101 serves as the step ST1, the configuration of the step ST1 is not limited thereto.

Figure 3A:
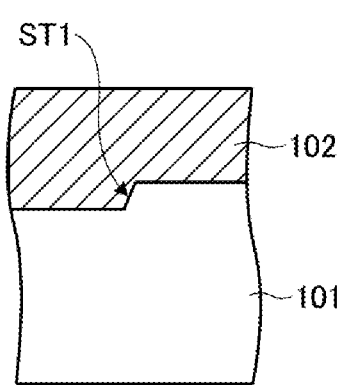
FIG. 3A is a cross-sectional view illustrating an example of a step provided in a boundary portion between a semiconductor substrate and an interlayer-insulating film and FIG. 3B is a cross-sectional view illustrating another example of the step provided in the boundary portion between the semiconductor substrate and the interlayer-insulating film.
Figure 3B:
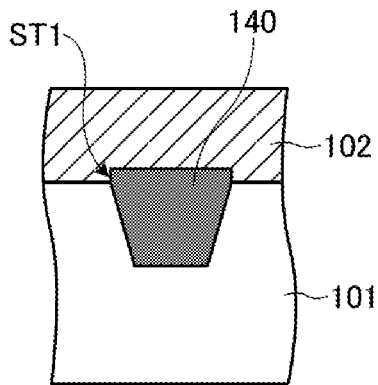

The step ST1 can also be achieved by the structures as illustrated in FIGS. 3A and 3B, for example.

FIG. 3A is a figure in which a portion of the step ST1 illustrated in FIG. 2 is enlarged to show an example of the step ST1. In this example, the surface of the semiconductor substrate 101 is made low so that the chip outer peripheral region PR side is lower than the circuit region CR side and the lower portion serves as the step ST1.

FIG. 3B is a figure in which the portion of the step ST1 illustrated in FIG. 2 is enlarged to show another example of the step ST1. In this example, a side surface portion on the chip outer peripheral region PR side in a portion projecting from the surface of the semiconductor substrate 101 of an STI film 140 formed to be embedded in the semiconductor substrate 101 and so that an upper portion thereof projects from the surface of the semiconductor substrate 101 serves as the step ST1. In the case of this example, since the adhesion strength of the interface between the STI film 140 and the interlayer-insulating film 102 is lower than the adhesion strength of the interface between the STI film 140 and the semiconductor substrate 101, the movement direction of the crack is more likely to change to the upward direction as compared with the example illustrated in FIG. 3A. The same also applies to an example in which the step ST1 is formed by the LOCOS film 130 illustrated in FIG. 2.

Hence, the step ST1 can be achieved by various kinds of configurations and is not limited to the configurations illustrated in FIG. 2, FIG. 3A, and FIG. 3B.

Next, a preferable positional relationship of the step ST1, the step ST2, and the seal ring 110 is described with reference to FIG. 4.

Figure 4:
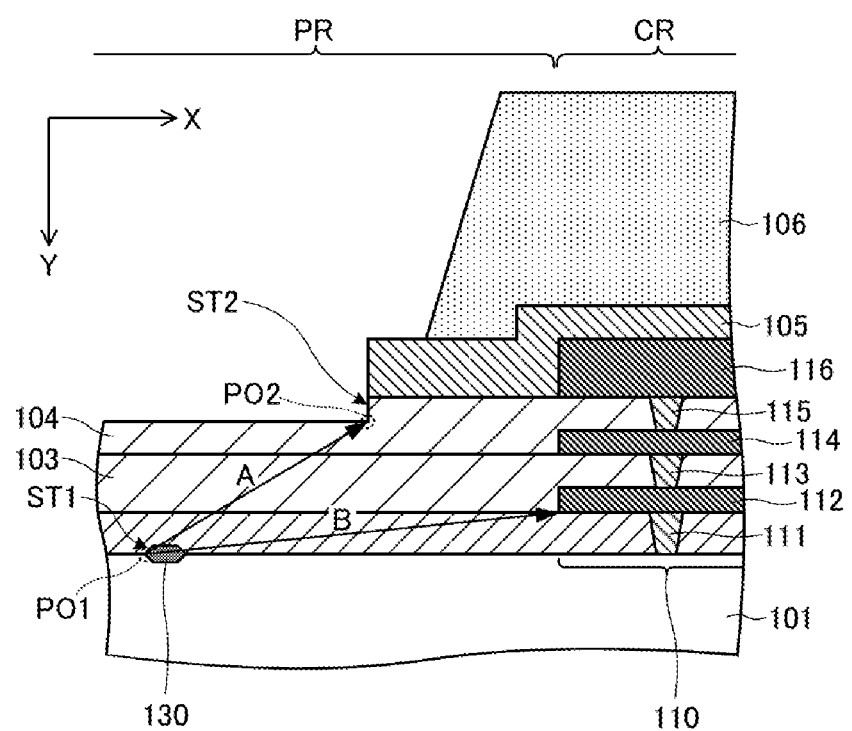
FIG. 4 is a cross-sectional view for explaining the positional relationship of the step provided in the boundary portion between the semiconductor substrate and the interlayer-insulating film, a step provided in an upper insulating film, and a seal ring.

As illustrated in FIG. 4, the semiconductor device of this embodiment includes the seal ring 110 for preventing moisture on the semiconductor substrate 101 in a region adjacent to the chip outer peripheral region PR in the circuit region CR. The seal ring 110, however, contains the lamination of the metal plugs and the metal films and can become a point where stress concentrates, and thus can also become a reaching point of a crack. If the crack entering from the dicing surface DS reaches the seal ring 110 and the metal films and the metal plugs forming the seal ring 110 are exposed, there is a possibility that another crack occurs therefrom, which is not desirable.

Accordingly, in this embodiment, the step ST1 and the step ST2 are disposed so that a distance A from a starting point PO1 of the step ST1 to a starting point PO2 of the step ST2 is shorter than the shortest distance B from the starting point PO1 of the step ST1 to the seal ring 110 (A<B). Hence, stress can be further concentrated on the step ST2 than the seal ring 110 and a crack can be guided to the step ST2 of the surface of the interlayer-insulating film 104.

Herein, the adjustment of the distance A between the step ST1 and the step ST2 can be performed not only in the X direction but in the Y direction. More specifically, the distance A may be shortened by lowering the step ST2 to the interlayer-insulating film 103, for example.

Next, a preferable position of the step ST1 is described with reference to FIGS. 5 and 6.

Figure 5:
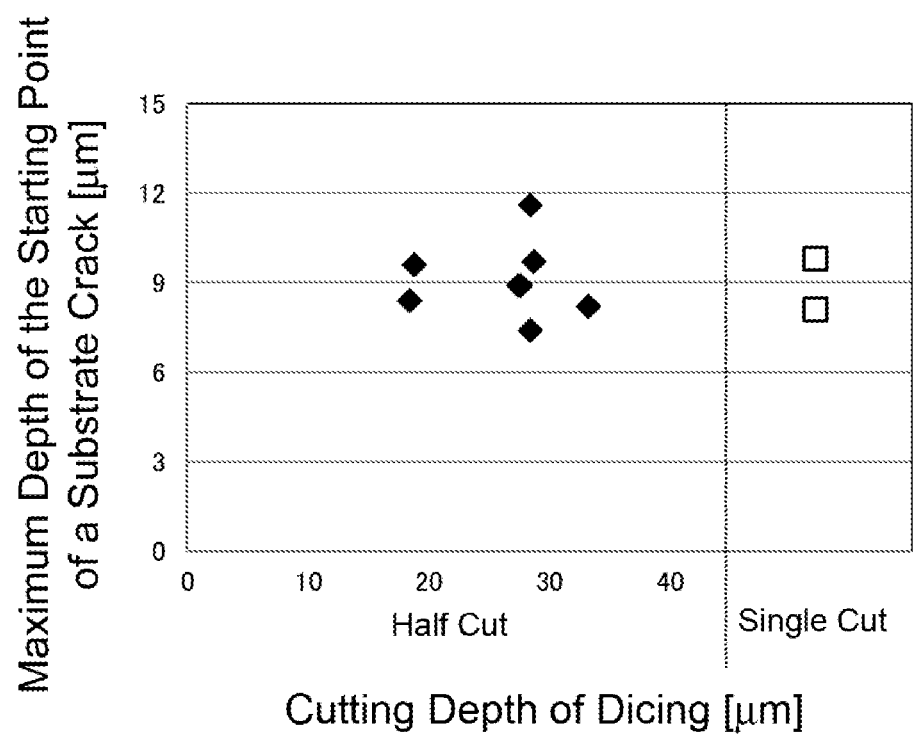
FIG. 5 is a figure illustrating the relation between the cutting depth of dicing and the maximum depth of the starting point of a substrate crack.

FIG. 5 is a figure illustrating the result of measurement of the maximum depth of the starting point of a substrate crack against the change in the cutting depth of dicing. It was found from FIG. 5 that, even when the cutting depth of dicing is changed, the maximum depth of the starting point of the substrate crack can take a substantially constant value although the value varies.

Figure 6:
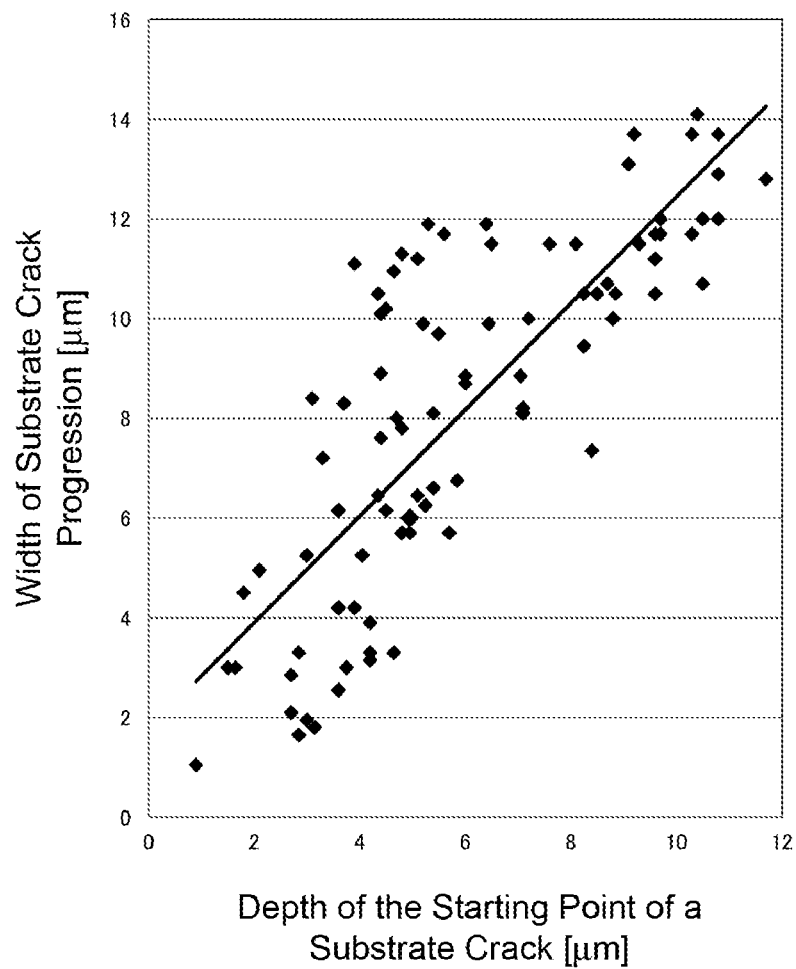
FIG. 6 is a figure illustrating the relation between the depth of the starting point of the substrate crack and the width in which the substrate crack progressed.

FIG. 6 is a figure illustrating the result of measurement of the depth of the starting point of the substrate crack and the width in which the substrate crack progressed at each depth. It was found from FIG. 6 that the ratio of the depth of the starting point of the substrate crack to the width in which the substrate crack progresses is about 1:1 (Angle 45°) and, when the depth of the starting point of the substrate crack is defined as x and the width in which the substrate crack progressed is defined as y and the plot of FIG. 6 is linearly approximated, the relation between x and y is substantially y=1.06x+1.8.

It is presumed from FIG. 5 that, since the maximum value of the maximum depth of the starting point of the substrate crack was about 12 μm, the width in which the substrate crack progresses from the dicing surface is 14.52 μm at the maximum according to the expression above. Accordingly, in order to have more effective function of the step ST1, it is preferable to set a horizontal distance D (see FIG. 2) from the dicing surface DS to the step ST1 to 15 μm or more.

Next, the first and the second modifications of the step ST2 provided in the upper interlayer-insulating film in the semiconductor device of this embodiment are described with reference to FIG. 7 and FIG. 8.

Figure 7:
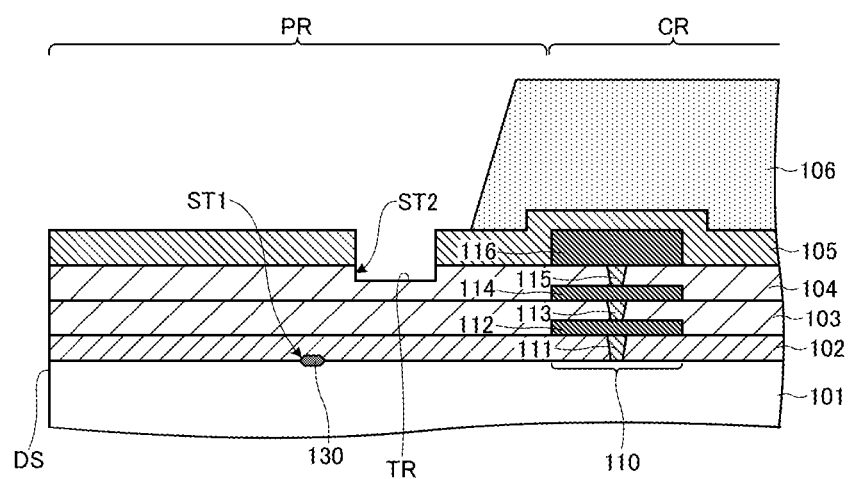
FIG. 7 is a figure illustrating a first modification of the step provided in the upper interlayer-insulating film in the semiconductor device of the embodiment of the present invention.

In the first modification, the passivation film 105 covers the interlayer-insulating film 104 also in the chip outer peripheral region PR as illustrated in FIG. 7 and a trench TR reaching the interlayer-insulating film 104 from the surface of the passivation film 105 is formed in the chip outer peripheral region PR in contrast to the example illustrated in FIG. 2. Hence, the inside surface on the chip outer peripheral region PR side of the trench TR serves as the step ST2 in this modification. Even in such a configuration in which the step ST2 is formed so that the chip outer peripheral region PR side is higher than the circuit region CR side, the step ST2 is a portion where stress concentrates particularly as with the example illustrated in FIG. 2 and similarly functions as the step ST2 illustrated in FIG. 2. Accordingly, when the passivation film 105 needs to cover the interlayer-insulating film 104 also in the chip outer peripheral region PR, for example, the step ST2 may be formed in this way.

Figure 8:
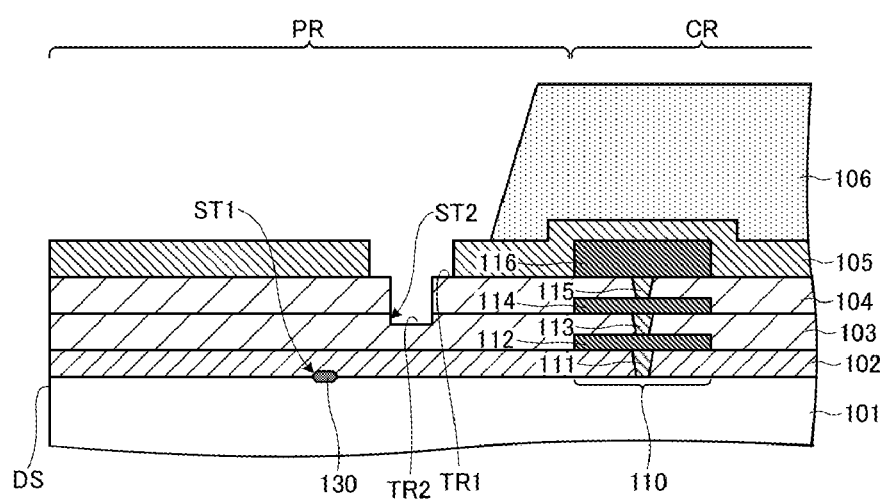
FIG. 8 is a figure illustrating a second modification of the step provided in the upper interlayer-insulating film in the semiconductor device of the embodiment of the present invention.

The second modification includes a trench TR1 formed in the passivation film 105 and a trench TR2 provided in the interlayer-insulating film 104 and having a width narrower than that of the trench TR1 under the trench TR1 as illustrated in FIG. 8 in place of the trench TR of the modification illustrated in FIG. 7. Hence, the inside surface on the chip outer peripheral region PR side of the trench TR2 functions as the step ST2 in this modification. In this embodiment, since the metal films forming the seal ring 110 contain the three layers (112, 114, 116), metal wiring layers (not illustrated) formed in the circuit region CR also contain three layers. For example, in the case where the number of the metal wiring layers formed in the circuit region CR becomes larger and, accordingly, the number of the interlayer-insulating films becomes larger, and thus it becomes difficult to make a deep trench at a time from the interlayer-insulating film of the top layer in order to shorten the distance A from the starting point PO1 of the step ST1 to the starting point PO2 of the step ST2 illustrated in FIG. 4, the distance A can be easily shortened by sequentially and stepwise forming a trench from the upper interlayer-insulating film according to this modification.

Figure 9:
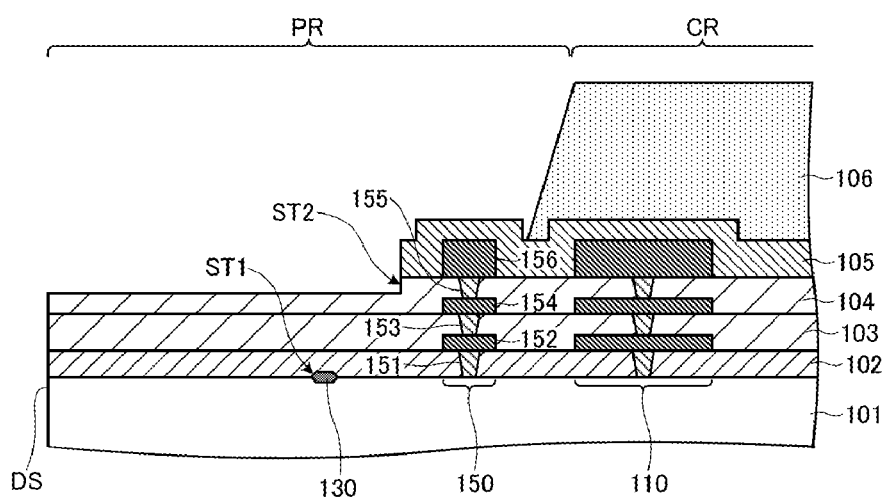
FIG. 9 is a figure illustrating a modification of the semiconductor device of the embodiment of the present invention.

FIG. 9 is a figure illustrating a modification of the semiconductor device of the embodiment of the present invention.

The semiconductor device of this modification further includes a metal structure 150 between the step ST2 and the seal ring 110 in the chip outer peripheral region PR of the semiconductor device illustrated in FIG. 2 as illustrated in FIG. 9.

The metal structure 150 contains a metal plug 151 connected to the semiconductor substrate 101 and provided in the interlayer-insulating film 102, a metal film 152 connected to the metal plug 151 and provided on the interlayer-insulating film 102, a metal plug 153 connected to the metal film 152 and provided in the interlayer-insulating film 103, a metal film 154 connected to the metal plug 153 and provided on the interlayer-insulating film 103, a metal plug 155 connected to the metal film 154 and provided in the interlayer-insulating film 104, and a metal film 156 connected to the metal plug 155 and provided on the interlayer-insulating film 104. The metal film 156 of the top layer is covered with the passivation film 105.

According to this modification, the interlayer-insulating films 102, 103, and 104 and the passivation film 105 become difficult to separate due to the presence of the metal structure 150. Accordingly, it becomes possible to further concentrate stress on the step ST2.

As described above, the embodiments of the present invention are described but it is a matter of course that the present invention is not limited to the embodiments described above and can be variously altered without deviating from the gist of the present invention.

What is claimed is:

1. A semiconductor device comprising:
    a semiconductor substrate containing a circuit region and a chip outer peripheral region adjacent to the circuit region;
    a first interlayer-insulating film in contact with a surface of the semiconductor substrate;
    a second interlayer-insulating film on the first interlayer-insulating film;
    a first step in a boundary portion between the surface of the semiconductor substrate and the first interlayer-insulating film so that a surface of the chip outer peripheral region is lower than a surface of the circuit region in the chip outer peripheral region;
    and a second step in the circuit region relative to the first step and in the second interlayer-insulating film in the chip outer peripheral region.

2. The semiconductor device according to claim 1, wherein the first step is an inclined portion in the chip outer peripheral region in a portion projecting from the surface of the semiconductor substrate below a LOCOS film on the surface of the semiconductor substrate.

3. The semiconductor device according to claim 1, wherein the first step is a depressed portion in a surface of the semiconductor substrate.

4. The semiconductor device according to claim 1, wherein the first step is a side surface portion of an STI film in the chip outer peripheral region projecting from a surface of the semiconductor substrate, the STI film embedded in the semiconductor substrate and having an upper portion that projects from the surface of the semiconductor substrate.

5. The semiconductor device according to claim 1, wherein the chip outer peripheral region is lower than the circuit region at the second step.

6. The semiconductor device according to claim 1, wherein the chip outer peripheral region is higher than the circuit region at the second step.

7. The semiconductor device according to claim 1 further comprising a first trench in the second insulating film, wherein the second step is a step portion in a chip outer peripheral region side of the first trench.

8. The semiconductor device according to a claim 1 further comprising:
   a first trench a passivation film; and
   a second trench under the first trench in the second interlayer-insulating film and having a width narrower than a width of the first trench, wherein
   the second step is a step portion on the chip outer peripheral region side of the second trench.

9. The semiconductor device according to claim 1 further comprising:
   a seal ring on the semiconductor substrate in a region adjacent to the chip outer peripheral region in the circuit region,
   wherein a distance from a starting point of the first step to a starting point of the second step is shorter than a shortest distance from the starting point of the first step to the seal ring.

10. The semiconductor device according to claim 1, wherein an end portion on a side opposite to the circuit region of the chip outer peripheral region is a dicing surface, and a horizontal distance from the dicing surface to the first step is 15 µm or more.

11. The semiconductor device according to claim 1 further comprising: a metal structure provided in the first interlayer-insulating film and the second interlayer-insulating film on a side of a chip region relative to the second step in the chip outer peripheral region.

* * * * *